(12) United States Patent
Standing et al.

(10) Patent No.: US 10,553,557 B2
(45) Date of Patent: Feb. 4, 2020

(54) ELECTRONIC COMPONENT, SYSTEM AND METHOD

(71) Applicant: Infineon Technologies Austria AG, Villach (AT)

(72) Inventors: Martin Standing, Velden (AT); Marcus Pawley, Kelsall (GB); Andrew Roberts, Denbigh (GB); Robert Clarke, East Peckham (GB)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/533,520

(22) Filed: Nov. 5, 2014

(65) Prior Publication Data

US 2016/0126210 A1  May 5, 2016

(51) Int. Cl.
*H05K 3/30* (2006.01)
*H01L 25/065* (2006.01)

(52) U.S. Cl.
CPC .. *H01L 25/0655* (2013.01); *H01L 2924/1304* (2013.01)

(58) Field of Classification Search
CPC .......... H05K 3/30; H05K 3/301; H05K 3/303; H05K 3/306; H05K 3/32; Y10T 29/49126; Y10T 29/49128; Y10T 29/4913; Y10T 29/49133; H01L 25/0655; H01L 2924/1304
USPC ............................ 29/829, 830, 831, 832–841
See application file for complete search history.

(56) References Cited

U.S. PATENT DOCUMENTS

| | | | | |
|---|---|---|---|---|
| 3,340,587 A | * | 9/1967 | Beyer | H05K 9/0016 29/897.3 |
| 4,563,725 A | * | 1/1986 | Kirby | H01L 23/4006 174/16.3 |
| 4,648,008 A | * | 3/1987 | Neyroud | H01L 23/4093 257/719 |
| 4,803,545 A | * | 2/1989 | Birkle | H01L 23/4093 174/16.3 |
| 4,858,479 A | * | 8/1989 | Voss | G01R 31/2818 73/865.9 |
| 4,879,434 A | * | 11/1989 | Assel | H05K 7/1425 174/366 |
| 4,906,201 A | * | 3/1990 | Young | H01R 13/6596 439/108 |
| 5,099,550 A | * | 3/1992 | Beane | H01L 23/4093 24/458 |

(Continued)

FOREIGN PATENT DOCUMENTS

CN  101976664 A  2/2011
CN  102740646 A  10/2012

(Continued)

*Primary Examiner* — Peter Dungba Vo
*Assistant Examiner* — Kaying Kue
(74) *Attorney, Agent, or Firm* — Murphy, Bilak & Homiller, PLLC

(57) ABSTRACT

In an embodiment, an electronic component includes a power semiconductor device embedded in a dielectric core layer and at least one contact layer protruding from a first side face of the dielectric core layer. The contact layer includes an electrically insulating layer and at least one contact pad arranged on the electrically insulating layer. The at least one contact pad is electrically coupled with the power semiconductor device.

18 Claims, 3 Drawing Sheets

(56) References Cited

U.S. PATENT DOCUMENTS

| | | | |
|---|---|---|---|
| 5,117,330 A * | 5/1992 | Miazga | H05K 3/301 174/138 G |
| 5,138,529 A * | 8/1992 | Colton | G06F 1/184 24/295 |
| 5,164,543 A * | 11/1992 | Benson | H05K 5/0021 174/351 |
| 5,235,492 A * | 8/1993 | Humbert | H04B 15/02 174/354 |
| 5,237,485 A * | 8/1993 | Cognetti de Martiis | H01L 23/4006 174/16.3 |
| 5,251,101 A * | 10/1993 | Liu | H01L 23/4093 24/625 |
| 5,344,113 A * | 9/1994 | Jurek | H05K 7/2049 248/316.7 |
| 5,450,284 A | 9/1995 | Wekell | |
| 5,506,612 A * | 4/1996 | Ogata | B41J 2/451 347/138 |
| 5,557,064 A * | 9/1996 | Isern-Flecha | H05K 3/284 174/378 |
| 5,594,204 A * | 1/1997 | Taylor | G06F 13/409 174/377 |
| 5,699,229 A * | 12/1997 | Brownell | H01L 23/4093 248/510 |
| 5,699,954 A * | 12/1997 | Bell | H05K 3/301 228/180.1 |
| 5,747,735 A * | 5/1998 | Chang | H01R 13/6485 174/51 |
| 5,796,583 A * | 8/1998 | Gale | H05K 7/20545 174/16.3 |
| 5,821,762 A | 10/1998 | Hamaguchi et al. | |
| 5,847,928 A * | 12/1998 | Hinshaw | H01L 23/4093 361/704 |
| 6,078,500 A * | 6/2000 | Beaman | H01L 23/3107 165/185 |
| 6,111,746 A * | 8/2000 | Wahl | H05K 9/0015 174/354 |
| 6,111,752 A * | 8/2000 | Huang | H01L 23/4093 165/80.2 |
| 6,171,151 B1 * | 1/2001 | Lu | H01F 27/027 439/620.23 |
| 6,321,443 B1 * | 11/2001 | Barte | H01L 23/50 29/831 |
| 6,362,965 B2 * | 3/2002 | Bookhardt | H01L 23/4093 24/458 |
| 6,381,813 B1 * | 5/2002 | Lai | H01L 23/4093 24/456 |
| 6,408,352 B1 | 6/2002 | Hosaka et al. | |
| 6,431,259 B2 * | 8/2002 | Hellbruck | H01L 23/4093 165/185 |
| 6,465,728 B1 * | 10/2002 | McLaughlin | H01L 23/4093 174/16.3 |
| 6,523,252 B1 * | 2/2003 | Lipponen | H01P 3/06 174/251 |
| 6,539,618 B1 * | 4/2003 | Lyke | H01R 43/02 29/611 |
| 6,587,344 B1 | 7/2003 | Ross | |
| 6,841,732 B2 * | 1/2005 | Yazaki | H05K 7/142 174/535 |
| 6,846,115 B1 * | 1/2005 | Shang | H01R 12/7076 385/92 |
| 6,893,268 B1 | 5/2005 | Harari et al. | |
| 6,945,786 B2 * | 9/2005 | Ammar | H01R 12/714 439/65 |
| 6,975,518 B2 * | 12/2005 | Frutschy | H01L 23/49811 257/E23.068 |
| 6,977,816 B2 * | 12/2005 | Lee | H01L 23/4093 165/80.3 |
| 7,012,809 B2 * | 3/2006 | Han | G06F 1/184 361/679.02 |
| 7,021,971 B2 | 4/2006 | Chou et al. | |
| 7,186,925 B2 | 3/2007 | Tsukahara et al. | |
| 7,203,066 B2 * | 4/2007 | Lee | H01L 23/4093 165/80.3 |
| 7,360,365 B2 * | 4/2008 | Codecasa | H01L 35/10 62/3.3 |
| 7,469,457 B2 * | 12/2008 | Ishikawa | H05K 13/0491 29/426.5 |
| 7,518,873 B2 * | 4/2009 | Park | H01L 23/4093 165/185 |
| 7,537,458 B2 * | 5/2009 | Idzik | H01R 4/02 439/65 |
| 8,156,644 B2 * | 4/2012 | Babb | H01L 23/552 174/377 |
| 8,482,923 B2 * | 7/2013 | Tan | H01L 23/4093 165/104.33 |
| 2003/0150645 A1 * | 8/2003 | Chiu | H05K 3/325 174/264 |
| 2003/0189246 A1 | 10/2003 | Iwaki et al. | |
| 2004/0099940 A1 * | 5/2004 | Standing | H01L 23/492 257/693 |
| 2004/0106229 A1 | 6/2004 | Jiang et al. | |
| 2004/0111876 A1 * | 6/2004 | Cheng | H01R 13/635 29/762 |
| 2005/0242434 A1 * | 11/2005 | Boggs | H01L 21/4853 257/737 |
| 2007/0227761 A1 | 10/2007 | Tuominen et al. | |
| 2007/0253179 A1 | 11/2007 | Briggs | |
| 2007/0261235 A1 * | 11/2007 | Byrd | H01L 21/4871 29/832 |
| 2008/0006923 A1 * | 1/2008 | Otremba | H01L 23/49551 257/686 |
| 2008/0128909 A1 | 6/2008 | Hann | |
| 2008/0251893 A1 * | 10/2008 | English | H05K 9/0032 257/659 |
| 2009/0154109 A1 * | 6/2009 | Chen | H01L 23/4093 361/709 |
| 2011/0026232 A1 | 2/2011 | Lin et al. | |
| 2011/0031611 A1 | 2/2011 | Standing | |
| 2011/0197438 A1 * | 8/2011 | Kikuchii | H01L 23/5387 29/832 |
| 2011/0247874 A1 | 10/2011 | Watanabe et al. | |
| 2011/0303449 A1 * | 12/2011 | Kobayashi | H05K 3/3436 174/260 |
| 2012/0075807 A1 | 3/2012 | Refai-Ahmed et al. | |
| 2012/0266459 A1 * | 10/2012 | Bessette | B23K 1/018 29/825 |
| 2013/0155723 A1 * | 6/2013 | Coleman | G02B 6/0018 362/621 |
| 2013/0242496 A1 * | 9/2013 | Ahmad | H05K 1/141 361/679.31 |
| 2013/0343000 A1 | 12/2013 | Shi et al. | |
| 2014/0168920 A1 * | 6/2014 | Hondo | H05K 3/1258 361/760 |
| 2015/0028487 A1 | 1/2015 | Meyer-Berg et al. | |

FOREIGN PATENT DOCUMENTS

| | | |
|---|---|---|
| CN | 103311193 A | 9/2013 |
| GB | 2163598 A | 2/1986 |
| JP | H04370957 A | 12/1992 |
| JP | 2007035739 A | 2/2007 |
| JP | 2013243345 A | 12/2013 |
| JP | 2014157857 A | 8/2014 |
| KR | 20050050557 A | 5/2005 |

* cited by examiner

ELECTRONIC COMPONENT, SYSTEM AND METHOD

BACKGROUND

An electronic component may include one or more semiconductor devices in a package. The package includes internal electrical connections from the semiconductor device to a substrate or a leadframe which includes outer contacts. The outer contacts are used to mount the electronic component on a redistribution board, such as a printed circuit board. The package may include a housing which covers the semiconductor device and the internal electrical connections. The housing may include a plastic material, such as epoxy resin, and may be formed by a mold process, such as injection molding.

SUMMARY

In an embodiment, a method includes arranging an electronic component on a first major surface of a circuit board in a peripheral edge region of the circuit board, the electronic component including a power semiconductor device embedded in a dielectric core layer, and applying a pressure exerting fixture to the electronic component to electrically couple at least one contact pad of the electronic component to at least one contact pad of the circuit board and to detachably attach the electronic component to the circuit board.

In an embodiment, an electronic component includes a power semiconductor device embedded in a dielectric core layer and at least one contact layer protruding from a first side face of the dielectric core layer. The contact layer includes an electrically insulating layer and at least one contact pad arranged on the electrically insulating layer. The at least one contact pad is electrically coupled with the power semiconductor device.

In an embodiment, a system includes means for mechanically detachably attaching an electronic component including a power semiconductor device embedded in a dielectric core layer to a circuit board such that at least one contact pad of the electronic component is electrically coupled to at least one contact pad of the circuit board arranged at a peripheral edge of the circuit board.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, the terms "coupled" and/or "electrically coupled" are not meant to mean that the elements must be directly coupled together-intervening elements may be provided between the "coupled" or "electrically coupled" elements.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
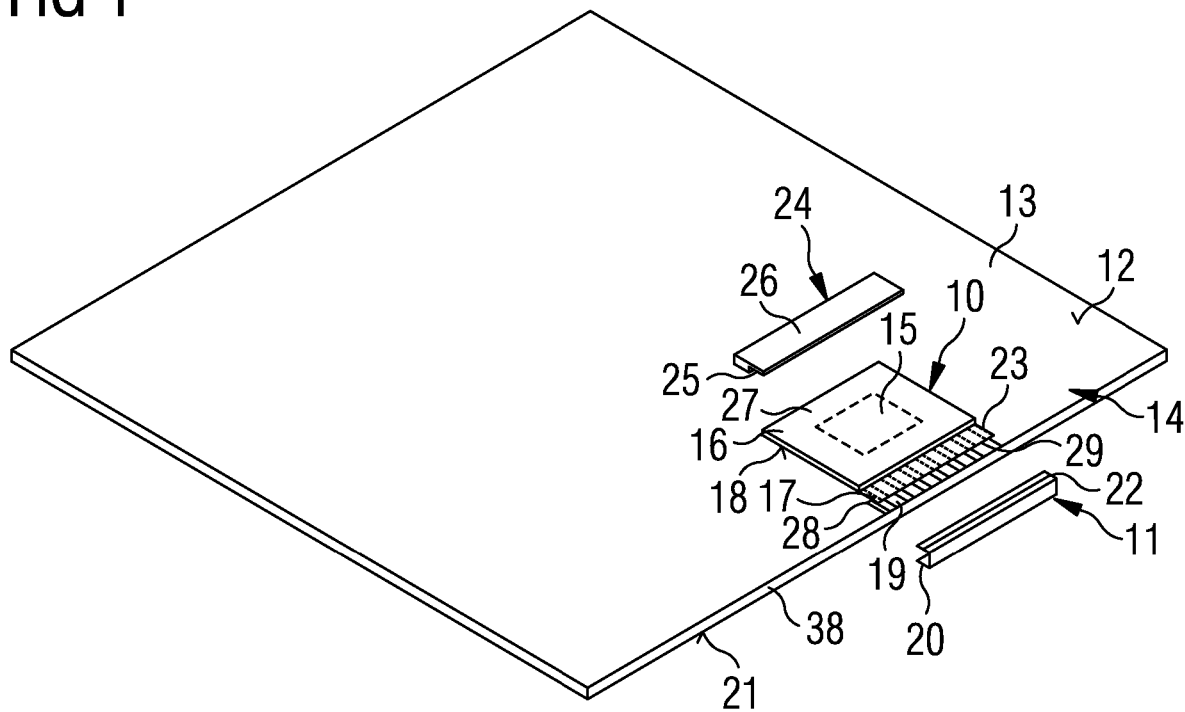
FIG. 1 illustrates an expanded perspective view of an electronic component, a fixture and a circuit board.
Figure 2:
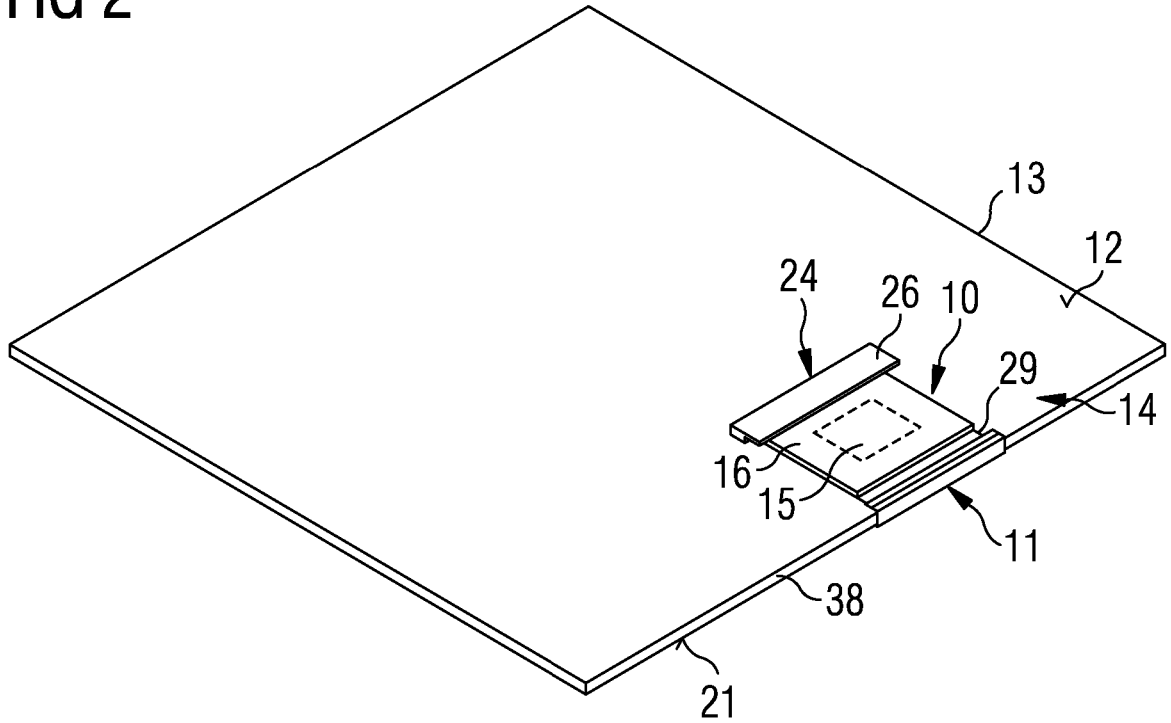
FIG. 2 illustrates the electronic component mounted on the circuit board by the fixture.
Figure 3:
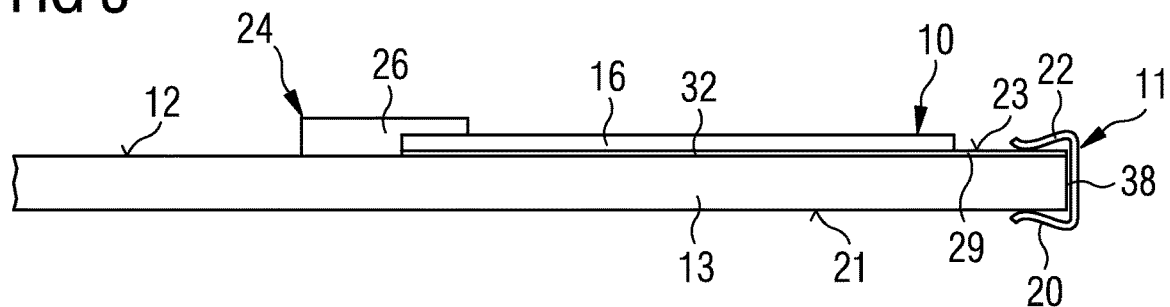
FIG. 3 illustrates a cross-sectional view of the electronic component mounted on the circuit board by the fixture.

FIG. 1 illustrates an expanded perspective view of an electronic component 10 and a fixture 11 for detachably attaching the electronic component 10 to a first major surface 12 of a circuit board 13. FIG. 2 illustrates the electronic component 10 mounted on the circuit board 13 by the fixture 11 and FIG. 3 illustrates a cross-sectional view of the electronic component 10 mounted on the circuit board 13 by the fixture 11.

The electronic component 10 is arranged on the first major surface 12 of the circuit board 13 in a peripheral edge region 14 of the circuit board 13. The electronic component 10 includes a power semiconductor device 15 embedded in a dielectric core layer 16 and at least one contact pad 17 which is arranged on the lower surface 18 of the electronic component 10 and faces towards contact pads 19 arranged in the peripheral edge region 14 of the circuit board 13. The contact pad 17 of the electronic component 10 is electrically coupled to a corresponding contact pad 19 of the circuit board 13 by a purely mechanical, surface to surface contact. The mechanical, surface to surface contact may be produced by applying the fixture 11 to the electronic component 10 and exerting pressure on the electronic component 10 with the fixture 11. In particular, pressure may be exerted by the fixture 11 on the region of the electronic component 10 including the contacts 17. The contacts 17 and contacts 19 may include contact pads.

In the embodiment illustrated in FIG. 2, the pressure exerting fixture 11 has the form of an elongated clip having a first leg 20 which is in contact with the lower surface 21 of the circuit board 13 and an upper leg 22 which is arranged in contact with an upper surface 23 of the electronic component 10. The legs 20, 22 are sized and shaped such that, when the fixture 11 is applied to the side face 38 and peripheral region 14 of the circuit board 13, the upper leg 22 is in contact with the upper surface 23 of the electronic component 10 whilst the lower leg 20 is in contact with the lower surface 21 of the circuit board 13 and pressure is applied to the contacts 17, 19. The clip may be used to mechanically detachably attach the electronic component 10 to the circuit board 13 and electrically couple the electronic component 10 to the circuit board 13.

In some embodiments, the fixture 11 is used in combination with a retainer 24 which may be arranged on or integral with the first major surface 12 of the circuit board 13. The retainer 24 may be used to define the position of the electronic component 10 on the first major surface of the circuit board 13 and may be used to prevent lateral movement of the electronic component 10 as the fixture 11 is applied. In some embodiments, the retainer 24 may be sized and shaped to prevent vertical movement of the electronic component 10; that is in directions substantially perpendicular to the first major surface 12 of the circuit board 13, as the fixture 11 is applied to the circuit board 13 and the electronic component 10.

In the embodiment illustrated in FIG. 1, the retainer 24 is substantially L-shaped and includes a cut-out portion 25 having a height and width which corresponds to the height and width of the electronic component 10 and a laterally protruding portion 26 which is arranged on the upper surface 23 of the electronic component 10 in a peripheral region 27 of the electronic component 10 opposing the peripheral region 28 in which the contacts 17 are arranged.

In the embodiment illustrated in FIG. 1, the contacts 17 are arranged at a single peripheral edge 28 of the electronic component 10. The contacts 17 are arranged on a contact layer 29 which is applied to the lower surface 32 of the dielectric core layer 16 of the electronic component 10. A portion of the contact layer 29 protrudes from the peripheral edge 28 of the dielectric core layer 16 so that, in this embodiment, the fixture 11 is applied to the contact layer 29 and the circuit board 13.

The fixture 11, which is used to exert pressure on the electronic component 10, may have different forms. The fixture 11 may include a contact surface having a shallow radius, for example a rounded form in order to direct the pressure exerted by the fixture over a smaller area. In the embodiment illustrated in FIGS. 1 to 3, in which the fixture 11 includes an elongated clip, the contact surfaces of the legs 20, 22 in contact with the lower surface 21 of the circuit board 13 and the electronic component 10 may include a rounded rib-like contour. The clip may be sized and shaped to apply a substantially similar pressure along the length of the electronic component 10 and, in particular, along the length of the portion of the contact layer 29 including the contacts 17.

In some embodiments, the fixture 11 may include an elongate clamp and rail assembly in which the clamp is applied to the electronic component 10 and, in particular, the protruding region 33 of the contact layer 29 including the contacts 17. The rail is applied to the clamp and mechanically fixed to the first major surface 12 of the circuit board 13 by, for example, screws, nuts and bolts etc. which may be arranged at opposing ends of the rail adjacent the clamp and electronic component 10.

Figure 4:
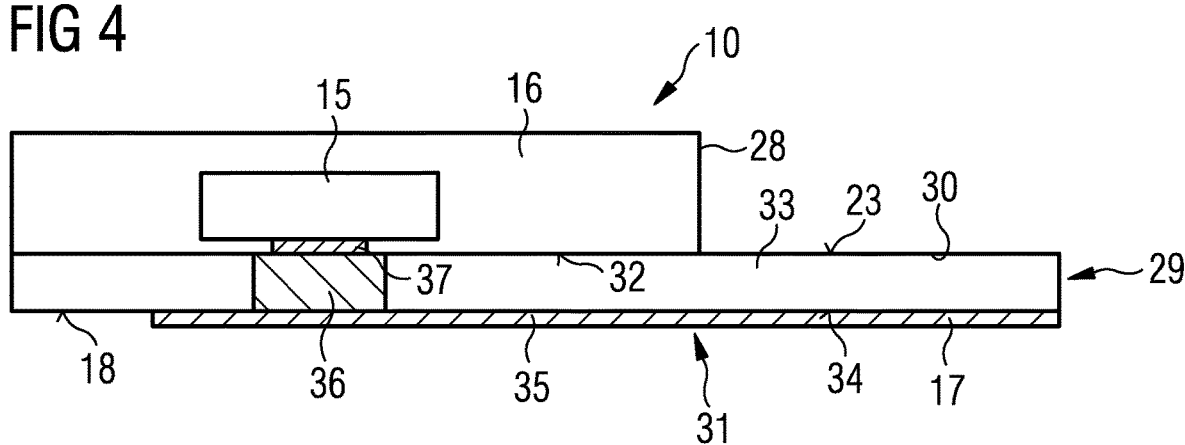
FIG. 4 illustrates a cross-sectional view of the electronic component.

FIG. 4 illustrates a cross-sectional view of the electronic component 10 and illustrates the features of the electronic component 10 in more detail. The electronic component 10 includes one or more power semiconductor devices 15 embedded in a dielectric core layer 16. The power semiconductor device 15 may be a power transistor device, for example. The power semiconductor device 15 may include a transistor device, such as a power transistor device having a vertical drift path. The power transistor device may include a MOSFET, an Insulated Gate Bipolar Transistor (IGBT) or a Bipolar Junction Transistor (BJT).

The electronic component 10 has a substantially planar rectangular form which is substantially defined by the shape of the dielectric core layer 16. The dielectric core layer 16 may include a substantially planar prefabricated board including a material such as glassfibre reinforced matrix, or other material, which is typically used to fabricate circuit boards such as the circuit board 13. For example, the dielectric core layer may include a glass fibre reinforced epoxy resin, such as FR4. The dielectric core layer may include PTFE (Polytetrafluoroethylene), PEN (Polyethylene Naphthalate), PET (Polyethylene Terephthalate, BT laminate (Bismaleimide-Triazine) or Polyimide, for example.

The power semiconductor device 15 may be embedded directly in the dielectric core layer 16 and be in direct contact with the material of the dielectric core layer 16 or the power semiconductor device 15 may be positioned in an aperture in the dielectric core layer 16. The regions between the side walls of the aperture and the power semiconductor device may be filled with adhesive or a dielectric material such as a polyimide.

The electronic component 10 is not limited to including a single power semiconductor device 15 but may include more than one semiconductor device embedded in the dielectric core layer 16. For example, the electronic component 10 may include two or more power transistor devices, a power transistor device and a diode or one or more power transistor devices and a control chip. The power semiconductor device and further semiconductor devices may be electrically coupled to form a circuit or part of a circuit, for example a half-bridge or a cascode configuration.

The electronic component 10 includes a contact layer 29 which in this embodiment includes a flexible insulating foil 30 and a conductive redistribution structure 31. The contact layer 29 is arranged on the lower surface 32 of the dielectric core layer 16 and protrudes from the peripheral edge region 28 of the dielectric core layer 16. The flexible insulating foil 30 may include polyimide, for example. The conductive redistribution structure 31 includes the contacts 17 in the form of contact pads which are arranged at the edge of the protruding portion 33 of the contact layer 29 which are arranged on the opposing surface of the contact layer 29 to the surface 35 which is attached to the lower surface 32 of the dielectric core layer 16.

The contact pads 17 are electrically coupled to the power semiconductor device 15 by one or more conductive traces 35 arranged on the lower surface 34 of the insulating foil 30 and one or more conductive vias 36 which extend through the thickness of the insulating foil 30. The conductive vias 36 may be in direct contact with the power semiconductor device 15. In some embodiments, the electronic component 10 may include a further one or more further conductive vias 37 extending between the semiconductor power device 15 and the lower surface 32 of the dielectric core layer 16.

Figure 5:
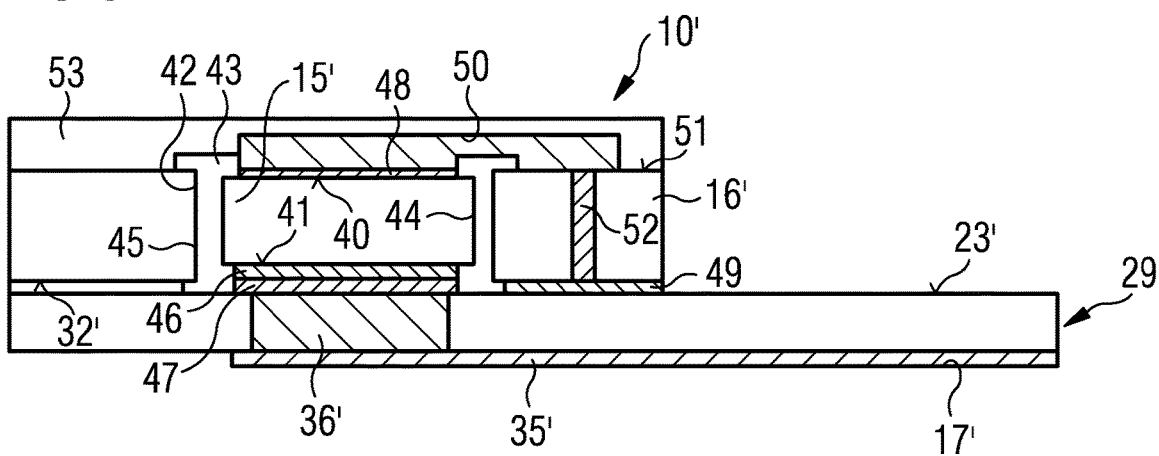
FIG. 5 illustrates a cross-sectional view of an electronic component.
Figure 6:
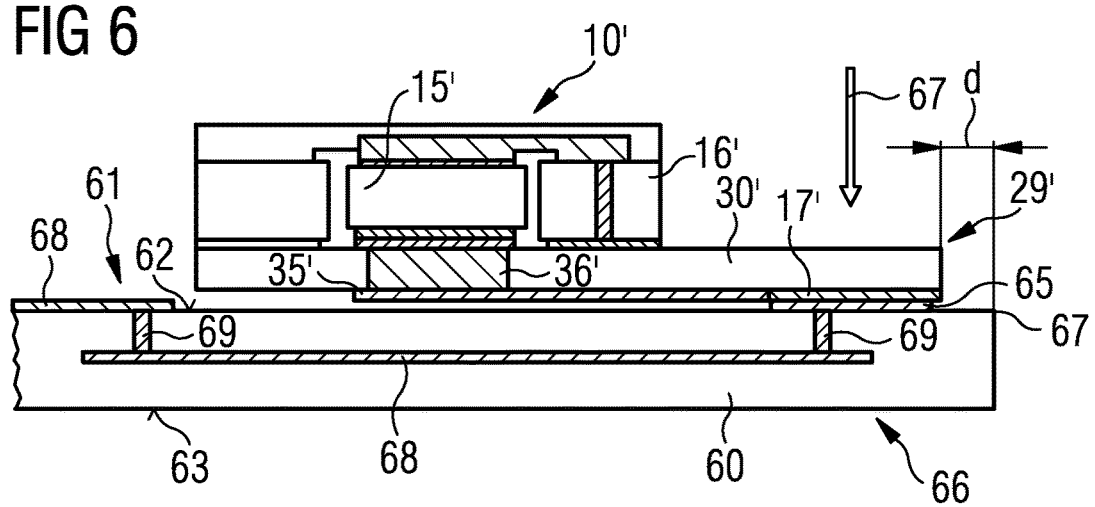
FIG. 6 illustrates a cross-sectional view of the electronic component of FIG. 5 mounted on a circuit board.

FIG. 5 illustrates a cross-sectional view of an electronic component 10' and FIG. 6 illustrates a cross-sectional view of the electronic component 10' of FIG. 5 mounted on a circuit board 60.

The electronic component 10' includes a power semiconductor device 15' embedded in a dielectric core layer 16'. In this embodiment, the power semiconductor device 15' is a vertical device and includes contact pads on its two opposing major surfaces 40, 41. The power semiconductor device 15' is mounted in an aperture 42 in the dielectric core layer 16' and secured in the aperture 42 by a dielectric layer 43 which extends between side faces 44 of the power semiconductor device 15' and side faces 45 defining the aperture 42. A conductive layer 47 is arranged on the contact pad 46 on the major surface 41 includes which is exposed in lower surface 32 of the dielectric layer core layer 16'. The contact pad 46 is electrically coupled to the contact pad 17' of contact layer 29' by the conductive via 36' and conductive trace 35'.

The contact pad 48 arranged on the opposing surface 40 of the power semiconductor device 15' is electrically coupled to a conductive layer 49 arranged on the lower surface 32 of the dielectric core layer 16' adjacent the aperture 42 by conductive layer 50 which extends from contact pad 48 on the upper surface 51 of the dielectric core layer 16' and a conductive via 52 which extends through the thickness of the dielectric core layer 16' and electrically couples the conductive layer 50 to the conductive layer 49. The conductive layer 49 is coupled to a further contact pad arranged on the lower surface 34' of the contact layer 29' by a conductive trace and via which cannot be seen in the cross-sectional view of FIG. 5.

The contact pads 46, 48 may be a source pad and a drain pad coupled to source and drain of a transistor device, for example. One or more of the major surfaces may include one or more further contact pads, for example a gate pad, sense pad etc.

The electronic component 10 may further include a dielectric layer 53 which covers the conductive layer 50 and the upper surface 51 of the dielectric core layer 16. The lower surface 32 and of the dielectric core layer 16 may also include a further dielectric layer.

FIG. 6 illustrates a cross-sectional view of the electronic component 10' illustrated in FIG. 5 mounted on a circuit board 60. The circuit board 60 includes a conductive redistribution structure 61 which may include conductive traces 68 arranged on one or both of the major surfaces 62, 63 and within the body of the circuit board 60 as well as conductive vias 69 which extend substantially perpendicularly to the major surfaces 62, 63. A plurality of contact pads 65 is arranged in the peripheral edge 66 of the circuit board 60, of which a single contact pad 65 can be seen in the cross-sectional view illustrated in FIG. 6.

The contact pad 17' of the electronic component 10' is electrically coupled to a corresponding contact pad 65 on the first major surface 62 of the circuit board 60 by a purely mechanical surface-to-surface connection. The purely mechanical connection between the electronic component 10' and the conductive redistribution structure 61 of the circuit board 60 is produced by applying mechanical pressure to the contacts as is illustrated schematically in FIG. 6 by the arrow 67. The purely mechanical electrically conductive connection between the electronic component 10' and the circuit board 60 enables the electronic component 10' to be reworked by removing the mechanical pressure. As is disclosed in connection with FIGS. 1 and 2, the mechanical pressure may be applied by applying a fixture to one or more major surfaces of the circuit board 60. The fixture may be a clip, clamp and rail assembly etc.

The contact pad 65 and the electronic component 10' may be spaced at a distance d from the edge 67 of the circuit board 60. The distance d may be defined by the creepage distance for the particular power semiconductor device or devices embedded in the electronic component 10'. In some embodiments, the distance d equals the creepage distance or is equal to 110% of the creepage distance.

As used herein, the creepage distance is defined as the shortest path between two conductive materials measured along the surface of an isolator which is positioned between the two conductive materials. Maintaining a minimum creepage distance may assist in reducing the risk of failure over time. The generation of a conductive path along the isolator surface due to the high voltage applied over long periods of time, i.e. creepage, is related to the RMS value and also may depend on environmental conditions which may be described by a degree of pollution and the materials characteristics of the isolator.

Figure 7:
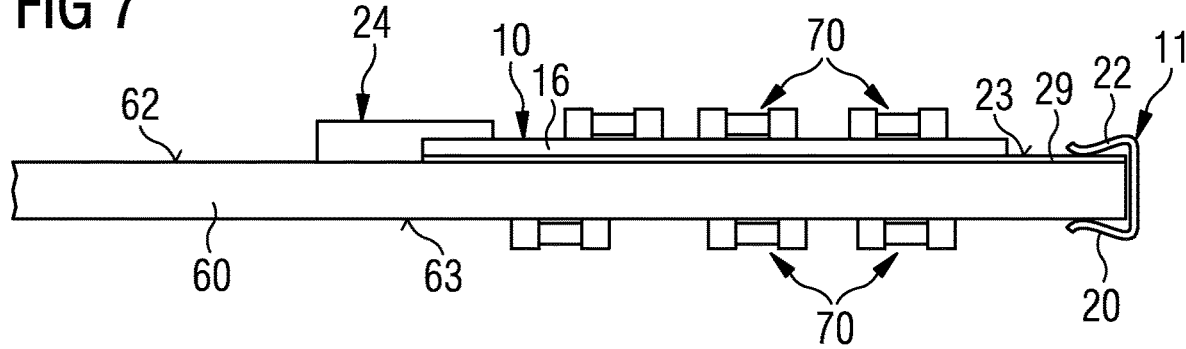
FIG. 7 illustrates a cross-sectional view of an arrangement of an electronic component and further devices on a circuit board.

FIG. 7 illustrates a cross-sectional view of an application of the electronic component 10; 10' and one or more further devices 70. The devices 70 may be passive devices such as inductors, capacitors and/or resistors and/or active devices, such as control chips, diodes and/or transistors. The one or more further devices 70 may be arranged on the lower surface 63 of the circuit board 60 directly underneath the electronic component 10 or may be mounted on the upper surface 51 of the dielectric core layer 16 and be arranged directly above the power semiconductor device 15; 15' which is embedded within the dielectric core layer 16; 16'. This arrangement may be used to save lateral space on the circuit board 60. The further devices 70 may be electrically coupled to the electronic component 10. This arrangement may be used to reduce parasitic capacitances in the electrical connections between the electronic component 10 and the further devices 70 by reducing the length of the conductive path between the electronic component 10 and the further device 70. Some embodiments, the further devices 70 are electrically isolated from the electronic component 10.

Figure 8:
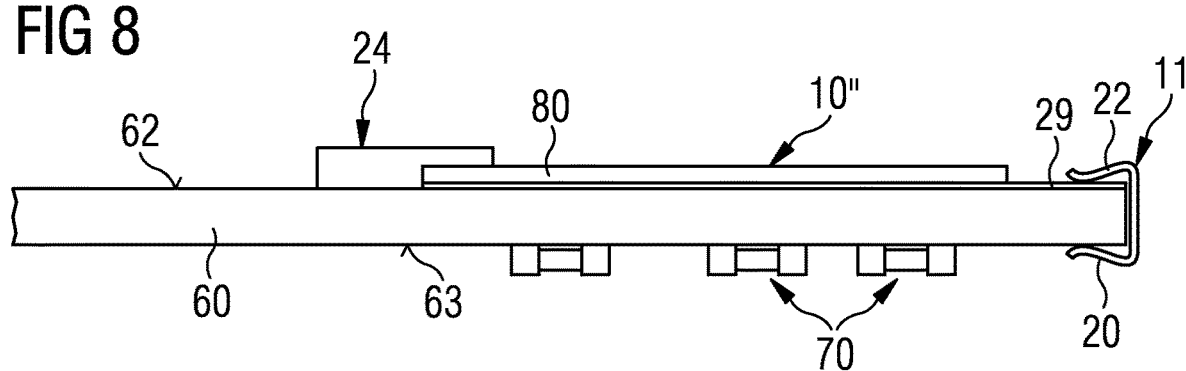
FIG. 8 illustrates a cross-sectional view of an electronic component including a heatspreader mounted on the circuit board.

FIG. 8 illustrates a cross-sectional view of an electronic component 10" including a heat spreader 80. The heat spreader 80 may be applied to the upper surface 51 of the dielectric core layer 16". In some embodiments, the heat-spreader 80 has a higher thermal conductivity in directions substantially parallel to the major surface of the one or more power semiconductor devices 15" than in directions substantially perpendicular to the major surface of the one or more power semiconductor devices 15". One or more further devices 70 may be arranged on the lower surface 63 of the circuit board 60 and may be arranged underneath the electronic component 10; 10'

The heat-spreader 80 may be configured to conduct heat to areas adjacent the side faces 44" of the power semiconductor device 15". For example, the heat-spreader 80 may have a lateral area which is greater than that of the power semiconductor device 15" which in combination with the anisotropic thermal conductivity may be used to assist the conduction of heat from the power semiconductor device 15" to regions of the heat-spreader 80 adjacent the side faces 44" of the power semiconductor device 15".

This anisotropic thermal conductivity may be provided by particles having anisotropic thermal conductivity and an anisotropic arrangement such that the heat-spreader has an average anisotropic thermal conductivity. For example, the particles may include graphite particle which have a preferred orientation within the heat spreader 80.

Graphite particles typically have a platelet shape in which the long direction has a higher thermal conductivity than the short direction. The platelets may be arranged such that the long directions of the platelets may, on average, extend in directions substantially parallel to the major surfaces 40", 41" of the power semiconductor device 15" and the thickness of the platelets may extend in directions substantially perpendicular to the major surfaces 40", 41" of the power semiconductor device 15".

Graphite behaves has an anisotropic thermal conductivity due to the orientation of the poly crystalline structures substantially arranged in the ab plane and the weak Van der Waals bonds in the c axis which bond the polycrystalline planes to one another. This leads to graphite delaminating and chipping in between poly crystalline planes by breakage of the Van der Waal's forces.

Graphite materials may have a lateral thermal conductivity, i.e. in the long direction, of up to 500 W/m–k for natural graphite and up to 1500 W/m–k for engineered graphite. The thermal conductivity of graphite in the vertical direction, i.e. the short direction of the platelet, is around 10 W/m–k. Therefore, a thermal conduction anisotropic ratio of at least around 50 to 1 may be provided.

In some embodiments, the graphite may be coated and/or the graphite may be sandwiched between two metal sheets, for example copper sheets to improve the workability of the heat-spreader composite. The particles may be sandwiched between a first metallic layer and a second metallic layer of the heat-spreader 80.

A heat-sink may also be applied to the heat spreader 80. The heat-sink may have a substantially isotropic thermal conductivity and may assist in dissipating heat from the heat-spreader 80 in vertical as well as lateral directions. The heat-sink 81 may also be embedded in a dielectric core layer.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures.

Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   arranging an electronic component on a first major surface of a circuit board in a first peripheral edge region of the circuit board, the electronic component comprising a power semiconductor device embedded in a dielectric core layer; and
   applying a pressure exerting fixture to the electronic component to electrically couple and detachably attach at least one contact pad of the electronic component to at least one contact pad of the circuit board and to detachably attach the electronic component to the circuit board,
   wherein the contact pads of the electronic component and the circuit board physically contact each other to produce the electrical coupling,
   wherein the at least one contact pad of the electronic component faces the first major surface of the circuit board and is disposed above the first major surface of the circuit board after applying the pressure exerting fixture, and
   wherein the applying the pressure exerting fixture to the electronic component comprises applying mechanical pressure to a contact region of the electronic component protruding from the dielectric core layer, the contact region comprising an electrically insulating layer and the at least one contact pad, the at least one contact pad being sized and shaped to correspond to the at least one contact pad arranged in the peripheral region of the first major surface of the circuit board.

2. The method according to claim 1, wherein the electronic component is arranged between a retainer arranged on the first major surface of the circuit board and the periphery of the circuit board.

3. The method according to claim 2, wherein the applying the pressure exerting fixture to the electronic component comprises:
   applying the pressure exerting fixture to a first side of the electronic component in which the at least one contact pad is arranged and hindering vertical movement of a second side of the electronic component opposing the first peripheral region by arranging the second peripheral region under a portion of a retainer attached to the first major surface of the circuit board.

4. The method according to claim 1, wherein the applying the pressure exerting fixture to the electronic component comprises:
   applying a clip to the periphery of the circuit board, the clip extending from a second major surface of the circuit board, over the side face of the circuit board onto the electronic component.

5. The method according to claim 4, further comprising applying a substantially similar pressure along a length of the electronic component contacted by the clip.

6. The method according to claim 1, wherein the applying the pressure exerting fixture to the electronic component comprises:
attaching a fixture to the first major surface of the circuit board and applying mechanical pressure by means of the fixture to the electronic component.

7. The method according to claim 1, further comprising arranging one or more further electronic components on at least one of the circuit board and the electronic component.

8. The method according to claim 1, wherein the power semiconductor device is a power transistor device.

9. The method according to claim 1, wherein the power semiconductor device is a power transistor device having a vertical drift path.

10. The method according to claim 1, wherein the power semiconductor device is a MOSFET, an Insulated Gate Bipolar Transistor (IGBT) or a Bipolar Junction Transistor (BJT).

11. The method according to claim 1, wherein the dielectric core layer comprises glassfibre reinforced matrix.

12. The method according to claim 1, wherein the dielectric core layer comprises one or more of PTFE (Polytetrafluoroethylene), PEN (Polyethylene Naphthalate), PET (Polyethylene Terephthalate, BT laminate (Bismaleimide-Triazine) and Polyimide.

13. The method according to claim 1, wherein the first major surface of the circuit board is substantially flat.

14. The method according to claim 1, wherein the applying the pressure exerting fixture to the electronic component electrically couples the at least one contact pad of the electronic component to the at least one contact pad of the circuit board by a purely mechanical surface to surface contact.

15. The method according to claim 1, wherein the peripheral edge region extends to an outer edge side of the circuit board, and wherein the pressure exerting fixture wraps around the outer edge side.

16. The method according to claim 15, wherein the at least one contact pad of the circuit board extends to the outer edge side of the circuit board, and wherein the electronic component is arranged on the first major surface of the circuit board such that the electronic component extends to the outer edge side of the circuit board and the at least one contact pad of the electronic component is directly above the at least one contact pad of the circuit board.

17. The method according to claim 15, wherein the pressure exerting fixture comprises a central span that extends between upper and lower spans, and wherein the pressure exerting fixture is applied to the electronic component such that: the upper span directly contacts an upper surface of the electronic component, the lower span directly contacts an underside of the circuit board, and the central span is laterally disposed outside of the outer edge side of the circuit board.

18. A method, comprising:
arranging an electronic component on a first major surface of a circuit board in a first peripheral edge region of the circuit board, the electronic component comprising a power semiconductor device embedded in a dielectric core layer; and applying a pressure exerting fixture to the electronic component to electrically couple and detachably attach at least one contact pad of the electronic component to at least one contact pad of the circuit board and to detachably attach the electronic component to the circuit board, wherein the contact pads of the electronic component and the circuit board physically contact each other to produce the electrical coupling, wherein the at least one contact pad of the electronic component faces the first major surface of the circuit board and is disposed above the first major surface of the circuit board after applying the pressure exerting fixture, wherein the electronic component is arranged between a retainer arranged on the first major surface of the circuit board and the periphery of the circuit board, and wherein the retainer is disposed completely above the first major surface of the circuit board.

* * * * *